(12) United States Patent
Özdemir et al.

(10) Patent No.: US 12,028,033 B2
(45) Date of Patent: Jul. 2, 2024

(54) FILTER CIRCUITRY USING ACTIVE INDUCTOR

(71) Applicant: Telefonaktiebolaget LM Ericsson (publ), Stockholm (SE)

(72) Inventors: Ufuk Özdemir, Lund (SE); Peter Caputa, Limhamn (SE); Kirill Kozmin, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 17/926,083

(22) PCT Filed: May 20, 2020

(86) PCT No.: PCT/EP2020/064190
§ 371 (c)(1),
(2) Date: Nov. 17, 2022

(87) PCT Pub. No.: WO2021/233546
PCT Pub. Date: Nov. 25, 2021

(65) Prior Publication Data
US 2023/0188118 A1 Jun. 15, 2023

(51) Int. Cl.
*H03H 11/04* (2006.01)
*H03D 7/14* (2006.01)
(Continued)

(52) U.S. Cl.
CPC ........... *H03H 11/04* (2013.01); *H03D 7/1491* (2013.01); *H03L 7/08* (2013.01); *H03M 1/12* (2013.01); *H03M 1/66* (2013.01)

(58) Field of Classification Search
None
See application file for complete search history.

(56) References Cited

U.S. PATENT DOCUMENTS 6,028,496 A 2/2000 Ko et al.
6,545,540 B1 4/2003 Enriquez
(Continued)

FOREIGN PATENT DOCUMENTS

DE 10012519 A1 10/2001
EP 0915565 A2 5/1999
(Continued)

OTHER PUBLICATIONS

Avitabile, G. et al., "A 18 GHz MMIC Biquad Active Filter", Jan. 1, 2002, pp. 1-3.
(Continued)

*Primary Examiner* — Jeffrey S Zweizig
(74) *Attorney, Agent, or Firm* — COATS & BENNETT, PLLC

(57) ABSTRACT

A filter circuitry (200) using an active inductor is disclosed. The filter circuitry (200) has a first terminal (In1/Out1) and a second terminal (In2/Out2). The filter circuitry (200) comprises a first transistor (M1) and a second transistor (M2). The filter circuitry (200) further comprises a first switch (S1), a second switch (S2), a first capacitor (C1), a second capacitor (C2) and a resistor (R). The first and second transistors (M1/M2) together with the resistor (R) and the first and second switches (S1/S2) are connected in a current mirror topology. The first and second capacitors (C1/C2) are connected at the first and second terminals of the filter circuitry (200) respectively. The filter circuitry (200) is configurable to either have the first terminal (In1/Out1) as input and the second terminal (In2/Out2) as output or have the first terminal (In1/Out1) as output and the second terminal (In2/Out2) as input by changing on-off states of the first and second switches. The transistors are interconnected in a current-mirror fashion. Depending on the switch position one of the transistors also acts as part of an active (Continued)

inductor such that the circuit functions as a low pass filter with a complex pole pair and a real pole. Depending on the switch position the LPF allows signal flow in either direction. For use in a TDD environment in combination with a passive mixer (420).

8 Claims, 7 Drawing Sheets

(51) Int. Cl.
  *H03L 7/08* (2006.01)
  *H03M 1/12* (2006.01)
  *H03M 1/66* (2006.01)

(56) References Cited

U.S. PATENT DOCUMENTS

| | | | |
|---|---|---|---|
| 7,135,932 | B2 | 11/2006 | Quadir et al. |
| 7,202,726 | B2 | 4/2007 | Kunanayagam et al. |
| 7,902,917 | B2 | 3/2011 | Mirzaei et al. |
| 8,289,067 | B2 | 10/2012 | Kucharski |
| 8,406,723 | B1 | 3/2013 | Lobo et al. |
| 8,588,726 | B2 | 11/2013 | Connell et al. |
| 9,197,257 | B2 | 11/2015 | Axholt |
| 9,774,315 | B2 * | 9/2017 | Namkoong .... H03K 19/017527 |
| 10,236,826 | B1 | 3/2019 | Darwhekar et al. |
| 11,201,589 | B2 * | 12/2021 | Özdemir .............. H03D 7/1441 |
| 2004/0057537 | A1 | 3/2004 | Kim et al. |
| 2005/0007199 | A1 | 1/2005 | Quadir et al. |
| 2009/0190692 | A1 | 7/2009 | Aniruddhan et al. |
| 2012/0200334 | A1 | 8/2012 | Connell et al. |
| 2013/0069165 | A1 | 4/2013 | Nedovic |
| 2015/0137870 | A1 | 5/2015 | Fujita et al. |
| 2016/0380618 | A1 | 12/2016 | Lu et al. |

FOREIGN PATENT DOCUMENTS

| | | |
|---|---|---|
| JP | H053418 A | 1/1993 |
| KR | 20100060880 A | 6/2010 |
| WO | 2019110128 A1 | 6/2019 |

OTHER PUBLICATIONS

Andriesei, C., "Study of Active Filters Topologies for Telecommunications Applications", Cergy-pontoise University PhD Thesis, Jan. 27, 2011, pp. 1-173, Cergy Pontoise University.

Pirola, A. et al., "Current-Mode, WCDMA Channel Filter With In-Band Noise Shaping", IEEE Journal of Solid-State Circuits, vol. 45 No. 9, Sep. 1, 2010, pp. 1770-1780, IEEE.

Takahashi, Y. et al., "On Chip LC Resonator Circuit Using an Active Inductor for Adiabatic Logic", 2009 52nd IEEE International Midwest Symposium on Circuits and Systems, Aug. 2, 2009, pp. 1171-1174, IEEE.

Hara, S. et al., "Lossless, Broadband Monolithic Microwave Active Inductors", IEEE MTT-S International Microwave Symposium Digest, Jun. 13, 1989, pp. 955-958, IEEE.

Wu, C-H., et al., "A 1V 4.2mW Fully Integrated 2.5Gb/s CMOS Limiting Amplifier using Folded Active Inductors", 2004 IEEE International Symposium on Circuits and Systems, May 23, 2004, pp. I-1044-1047, IEEE.

\* cited by examiner (a) (b)

(c) (d)

(a)

(b)

FILTER CIRCUITRY USING ACTIVE INDUCTOR

TECHNICAL FIELD

Embodiments herein relate to a filter circuitry. In particular, they relate to a low-pass-filter (LPF) implemented by using active inductor.

BACKGROUND

Wireless communication systems usually comprise complex chains of transmitter and receiver circuits, including several frequency conversion steps. The transmitter circuits typically up-convert baseband signals to radio frequency (RF) signals for transmission, and the receiver circuits down-convert received RF signals to baseband signals for processing. Such frequency conversion requires mixers to mix two signals.

A transmitter (Tx) usually consists of digital to analog converter (DAC), low-pass filter (LPF), up-converting mixer and power amplifier blocks. Similarly, a receiver (Rx) consists of analog to digital (ADC), LPF, down-converting mixer and low noise amplifier blocks. Many wireless systems operate in frequency division duplex (FDD) mode, where Tx and Rx are active at the same time. This makes it very difficult to use the same hardware blocks in Tx and Rx modes. However, there are also many wireless systems operating in time division duplex (TDD) mode. These systems have either Tx or Rx turned on one at a time, making it easier to share the same hardware blocks. For examples, the second generation (2G), time division-code division multiple access (TD-CDMA), time division long term evolution (TD-LTE), 5G high band etc. systems.

Analog low pass filters are used as anti-alias filters in both transmitters and receivers placed between data converters and frequency converters, i.e. after digital-to-analog converters (DACs) in transmitters and in-front of analog-to-digital converters (ADCs) in receivers. Usually they are implemented as op-amps with feedback elements generating complex poles to suppress alias frequencies effectively while passing desired signal with minimum distortion. Other alternatives are to use active or passive components like inductors, capacitors and resistors to form these filters. However, most applications require the filter poles to be complex to reach the required attenuation at the stop band while keeping pass-band gain droop at minimum. A real pole gives 3 dB attenuation at pole frequency, e.g. if 3rd order filtering is needed to reach the required stop band attenuation, this will cause 9 dB attenuation at pole frequency. If all poles are at the same location, which means an unavoidable, significant "gain droop" in the passband. For example, a real pole/zero has a Q value of 0.5, which means 3 dB deviation at pole/zero frequency. A complex pole pair has a Q which is, per definition greater than 0.5, causing less "gain droop". If Q value is greater than 0.707, the frequency response even shows a peaking in the pass band.

A usual way to generate complex poles is to use an op-amp in feedback configuration. However, with increasing signal bandwidths this comes at a high price of current consumption. The reason is that the op-amp requires 5-10 times higher bandwidth than the signal bandwidth, referred as unity gain bandwidth (UGB) or gain bandwidth product (GBP), in order to keep the loop gain high in the pass band. If high order filters are required, more op-amps are needed increasing current consumption even further. For example, nowadays base transceiver station (BTS) requirements on 5G products are 400 MHz instantaneous bandwidth (IBW) and there are even discussions on 800 MHz IBW, which means 200 MHz baseband BW on in-phase and quadrature-phase signal. This means digital pre-distortion (DPD) bandwidth will be higher. Depending on the linearity requirement which sets how high loop gain needs to be, this means the op-amp needs to have a UGB about 3-6 GHz. If 800 MHz IBW is required, this might need to be doubled, which makes it difficult to achieve even at high current consumption.

Another way to generate complex poles is to use transconductance-capacitance (gm-C) type filters. Unfortunately, they have poor linearity at low supply voltages due to large input and output voltage swings.

SUMMARY

Therefore, it is an objective of embodiments herein to provide a low-pass filter with improved performance.

According to one aspect of embodiments herein, the objective is achieved by a filter circuitry having a first terminal and a second terminal. The filter circuitry comprises a first transistor having a first terminal, a second terminal and a third terminal; a second transistor having a first terminal, a second terminal and a third terminal. The filter circuitry further comprises a first switch and a second switch, a first capacitor and a second capacitor, and a resistor. The first terminal of the first transistor, a first terminal of the first switch and a first terminal of the first capacitor are connected to the first terminal of the filter circuitry. The first terminal of the second transistor, a first terminal of the second switch and a first terminal of the second capacitor are connected to the second terminal of the filter circuitry. The second terminal of the first transistor, the second terminal of the second transistor and a first terminal of the resistor are connected together. The third terminals of the first and second transistors are connected together. A second terminal of the first switch, a second terminal of the second switch and a second terminal of the resistor are connected together. Second terminals of the first and second capacitors are connected to a signal ground. The filter circuitry is configurable to either have the first terminal as input and the second terminal as output or have the first terminal as output and the second terminal as input by changing on-off states of the first and second switches.

In other words, according to the embodiments herein, a filter circuitry with low pass characterization is realized by using an active inductor. The current mirror connection of the first and second transistors forms an active inductor. This makes it possible to generate complex poles with good Q values and reach high bandwidth. By means of the first and second switches, the current mirror is made switchable, and the filter circuitry can easily be made bidirectional. The filter circuitry can be easily integrated with a DAC or ADC and a passive mixer. Since a passive mixer is already bidirectional, the bidirectional filter circuitry and mixer combination can be used both in transmitting and receiving mode.

The filter circuitry according to embodiments herein has some advantages:

The filter circuitry inherently has high bandwidth, as the traditional trade-off between bandwidth and current consumption does not exist in this topology.

The bandwidth may be scalable by implementing the first and second capacitors and the resistor with switching or variable capacitors and resistors, which makes it possible to fit into different products having various IBWs.

The filter circuitry is robust compared to op-amp based solutions, since there are no feedback loops, neither differential nor common mode, which eliminates stability issues.

It is simple, no bias voltages and reference currents etc. are required.

Since the whole filter circuitry consists of a single current mirror, it is possible to operate it at very low supply voltages.

The complex pole-pair is formed at the input, i.e. the diode connected transistor side of the current mirror depending on states of the first and second switches, independently of the current mirror gain. Gain of the current mirror can be changed without disturbing the complex poles, making gain programmability possible.

The bidirectional property of the filter circuitry enables transmitting and receiving operations on the same LPF and mixer chain. This way, the LO distribution will become smaller and it will consume less current.

Therefore, the filter circuitry according to embodiments herein provides a low pass filter with improved performance.

BRIEF DESCRIPTION OF THE DRAWINGS

Examples of embodiments herein are described in more detail with reference to attached drawings in which.

DETAILED DESCRIPTION

Figure 1:
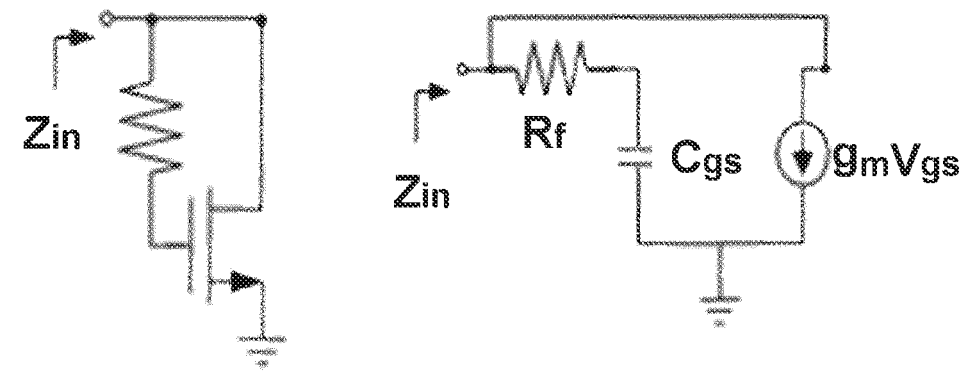
FIG. 1 (a) is a schematic view of an active inductor according to prior art; (b) is a small signal model of the active inductor shown in (a); (c) is a plot showing input impedance of the active inductor; and (d) is a small signal equivalent circuit view of the active inductor.
Figure 1:
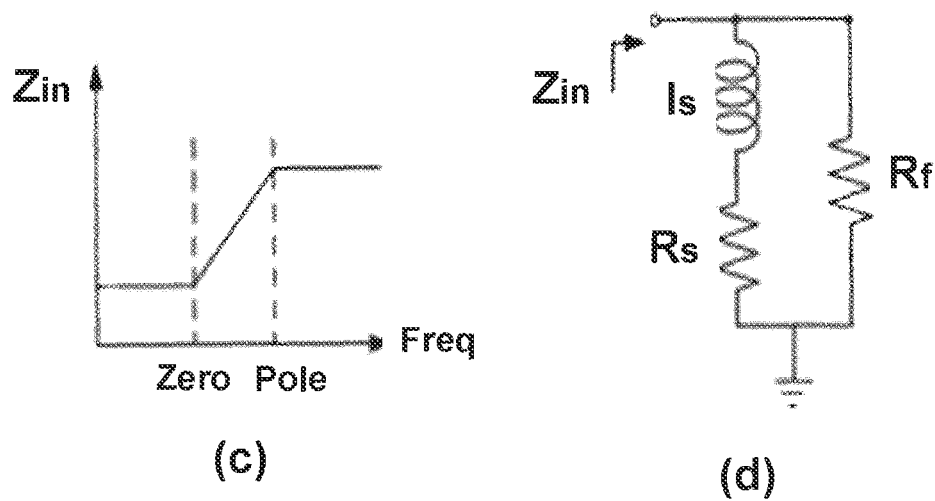

As a part of developing embodiments herein, an active inductor according to prior art will first be discussed. In "A 1V 4.2 mW fully integrated 2.5 Gb/s CMOS limiting amplifier using folded active inductors", 2004 *IEEE International Symposium on Circuits and Systems* (*IEEE Cat. No.* 04*CH*37512), Wu et. al. proposed an active folded inductor used as a peaking inductor in a limiting amplifier. Their goal was to extend the bandwidth of the limiting amplifier by cancelling the parasitic capacitances with the active inductor. FIG. 1 (a) shows a schematic view of the Wu's active inductor; (b) shows a small signal model of the active inductor; (c) shows input impedance of the active inductor over frequency; and (d) shows a small signal equivalent circuit of the Wu's active inductor. Note from FIG. 1 that Wu's folded active inductor circuit is very similar to a diode connected metal-oxide-silicon (MOS) transistor, which may be used as an input of a current mirror. The only difference is the resistance at the gate. The same transistor can be used as active inductor, and as part of a current mirror pair.

Figure 2:
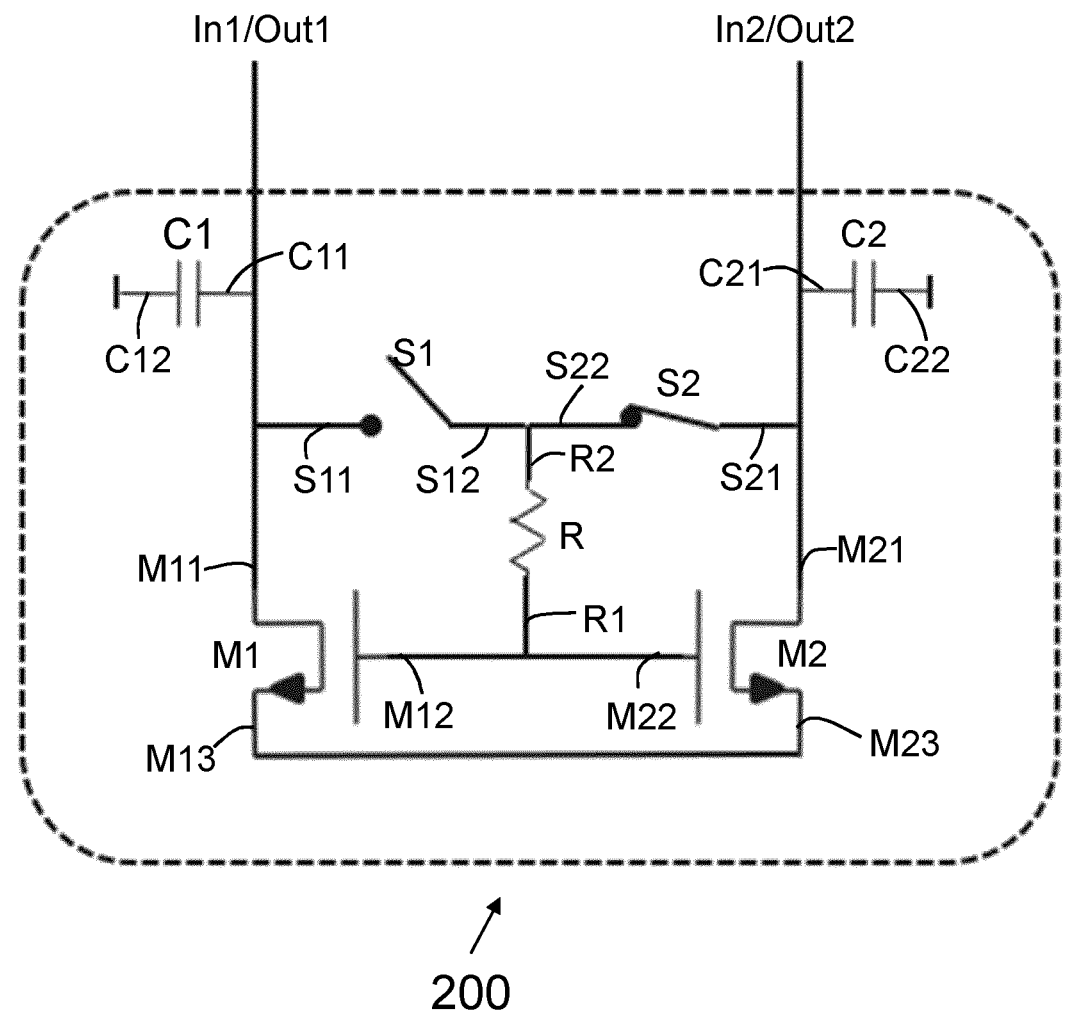
FIG. 2 is a schematic view illustrating a filter circuitry according to embodiments herein.

Based on this observation, a filter circuitry 200 according to embodiments herein using an active inductor similar as Wu's inductor is developed and shown in FIG. 2.

The filter circuitry 200 has a first terminal In1/Out1 and a second terminal In2/Out2.

The filter circuitry 200 comprises a first transistor M1 having a first terminal M11, a second terminal M12 and a third terminal M13, and a second transistor M2 having a first terminal M21, a second terminal M22 and a third terminal M23.

The filter circuitry 200 further comprises a first switch S1, a second switch S2, a first capacitor C1, a second capacitor C2 and a resistor R.

The first and second transistors M1/M2 together with the resistor R and the first and second switches S1/S2 are connected in a current mirror topology. The first and second capacitors C1/C2 are connected at the first and second terminals of the filter circuitry 200 respectively. The connections of the components in the filter circuitry 200 are as following:

The first terminal M11 of the first transistor M1, a first terminal S11 of the first switch S1 and a first terminal C11 of the first capacitor C1 are connected to the first terminal In1/Out1 of the filter circuitry 200;

The first terminal M21 of the second transistor M2, a first terminal S21 of the second switch S2 and a first terminal C21 of the second capacitor C2 are connected to the second terminal In2/Out2 of the filter circuitry 200;

The second terminal M12 of the first transistor M1, the second terminal M22 of the second transistor M2 and a first terminal R1 of the resistor R are connected together;

The third terminals M13, M23 of the first and second transistors M1, M2 are connected together;

A second terminal S12 of the first switch S1, a second terminal S22 of the second switch S2 and a second terminal R2 of the resistor R are connected together; and Second terminals C12, C22 of the first and second capacitors C1, C2 are connected to a signal ground.

The filter circuitry 200 is configurable to either have the first terminal In1/Out1 as input and the second terminal In2/Out2 as output or have the first terminal In1/Out1 as output and the second terminal In2/Out2 as input by changing on-off states of the first and second switches S1, S2.

As can be seen, the filter circuitry 200 has Wu's inductor embedded in a current mirror and is bidirectional by using two switches S1 and S2, which swap the input or output role of the transistors M1 and M2 in the current mirror. In this way, the filter circuitry 200 may be used as a LPF which may be made bidirectional by the two switches.

Note that the active inductor and the shunt capacitor at the input side forms a complex pole pair, while the shunt capacitor at the output side forms a real pole.

Figure 3:
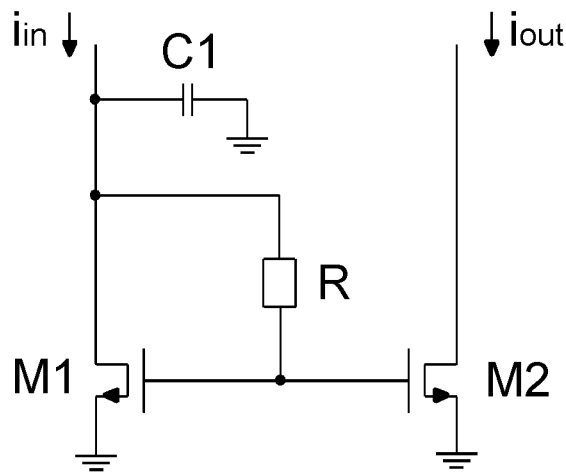
FIG. 3 (a) is a simplified schematic view of the filter circuitry according to embodiments herein when operates in one of the two directions; (b) is a small signal equivalent circuit of the filter circuitry shown in (a)
Figure 3:
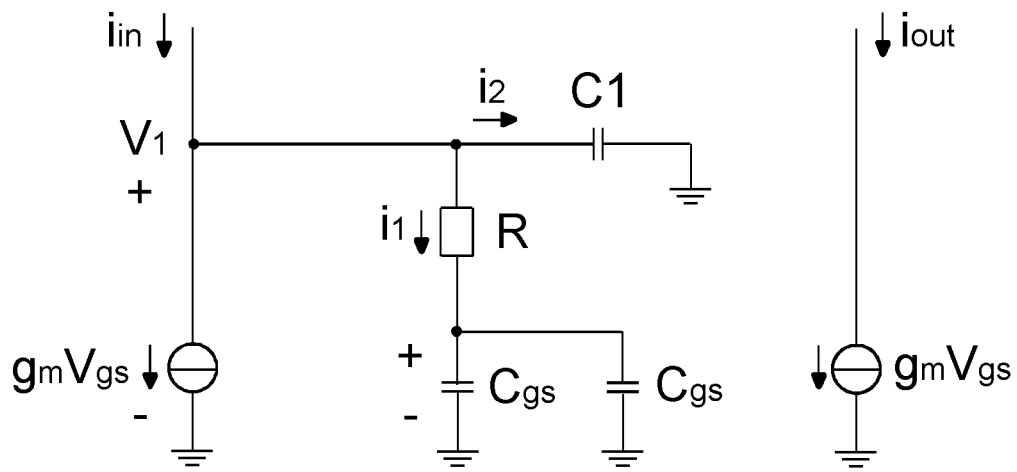

To derive a transfer function H(s) of the filter circuitry 200 which generates complex poles, a simplified schematic of the filter circuitry 200 when operating in one of the two directions, where S1 is turned on and S2 is turned off, is shown in FIG. 3 (a). For simplicity, the real pole is not included, so C2 is ignored in FIG. 3 (a). FIG. 3 (b) shows a small signal equivalent circuit of the filter circuitry 200 shown in (a).

The input current is $$i_{in} = g_m \cdot v_{gs} + i_1 \cdot i_2 \quad (1)$$

The output current is $$i_{out} = g_m \cdot v_{gs} \quad (2)$$

The voltage at the input is $$V_1 = i_1 \cdot \left(R + \frac{1}{S2C_{gs}}\right) = i_2 \cdot \frac{1}{sC_1} \rightarrow i_2 = i_1 \cdot \left(R + \frac{1}{S2C_{gs}}\right) \cdot sC_1 \quad (3)$$

The gate voltage of the transistor is $$V_{gs} = i_1 \cdot \frac{1}{S2C_{gs}} \quad (4)$$

Insert Eq. (4) into Eq. (2):

$$i_{out} = g_m \cdot \frac{i_1}{S2C_{gs}} \rightarrow i_1 = \frac{i_{out} \cdot s2C_{gs}}{g_m} \quad (5)$$

Insert Eq. (5) into Eq. (3):

$$i_2 = \frac{i_{out} \cdot s2C_{gs}}{g_m} \cdot \left(R + \frac{1}{S2C_{gs}}\right) \cdot SC_1 \quad (6)$$

Insert Eq. (2), (5) and (6) into Eq. (1):

$$i_{in} = i_{out} + i_{out} \cdot \frac{S2C_{gs}}{g_m} + \frac{i_{out} \cdot S2C_{gs}}{g_m} \cdot \left(R + \frac{1}{S2C_{gs}}\right) \cdot SC_1$$

$$i_{in} = i_{out}\left[1 + \frac{S2C_{gs}}{g_m} + \frac{SC_1}{g_m} \cdot (1 + S2C_{gs}R)\right]$$

$$i_{in} = i_{out}\left[1 + \frac{S2C_{gs}}{g_m} + \frac{SC_1}{g_m} + \frac{S^2 2C_{gs}RC_1}{g_m}\right]$$

Then the transfer function H(s) is $$H(S) = \frac{i_{out}}{i_{in}} = \frac{g_m}{g_m + S(2C_{gs} + C_1) + S^2(2C_{gs}RC_1)}$$

$$H(S) = \frac{1}{S^2\left(\frac{2C_{gs}RC_1}{g_m}\right) + S\left(\frac{2C_{gs} + C_1}{g_m}\right) + 1}$$

$$H(S) = \frac{N(S)}{S^2\left(\frac{1}{\omega_0^2}\right) + S\left(\frac{1}{Q\omega_0}\right) + 1}$$

The complex poles are $$\frac{1}{\omega_0^2} = \frac{2C_{gs}RC_1}{g_m} \rightarrow \omega_0 = \pm\sqrt{\frac{g_m}{2C_{gs}RC_1}}$$

And the Q value of the poles is $$\frac{1}{Q\omega_0} = \frac{2C_{gs} + 1}{g_m} \rightarrow Q = \frac{g_m}{(2C_{gs} + 1)} \cdot \sqrt{\frac{2C_{gs}RC_1}{g_m}}$$

$$Q = \frac{\sqrt{g_m \cdot 2C_{gs}RC_1}}{2C_{gs} + C_1}$$

It can be seen from the transfer function that the filter circuitry 200 may be configured to be a low pass filter and that it is possible to generate complex poles with good Q values and reach high bandwidth by using an active inductor.

According to some embodiments herein, the first and second capacitors C1, C2 may be implemented with variable capacitors or switchable capacitor banks. The resistor R may be implemented with variable resistors or switchable resistor banks. That is, the bandwidth of the filter circuitry 200 may be made scalable by switching capacitors and resistors, which makes it possible to fit into different products having various IBWs.

The filter circuitry 200 has current mirror topology and may be easily integrated with a DAC/ADC and a mixer. By making the current mirror switchable, the filter circuitry 200 can easily be made bidirectional. Since a passive mixer is already bidirectional, a bidirectional filter and mixer combination can be obtained which can be used both in transmitting and receiving mode.

Figure 4:
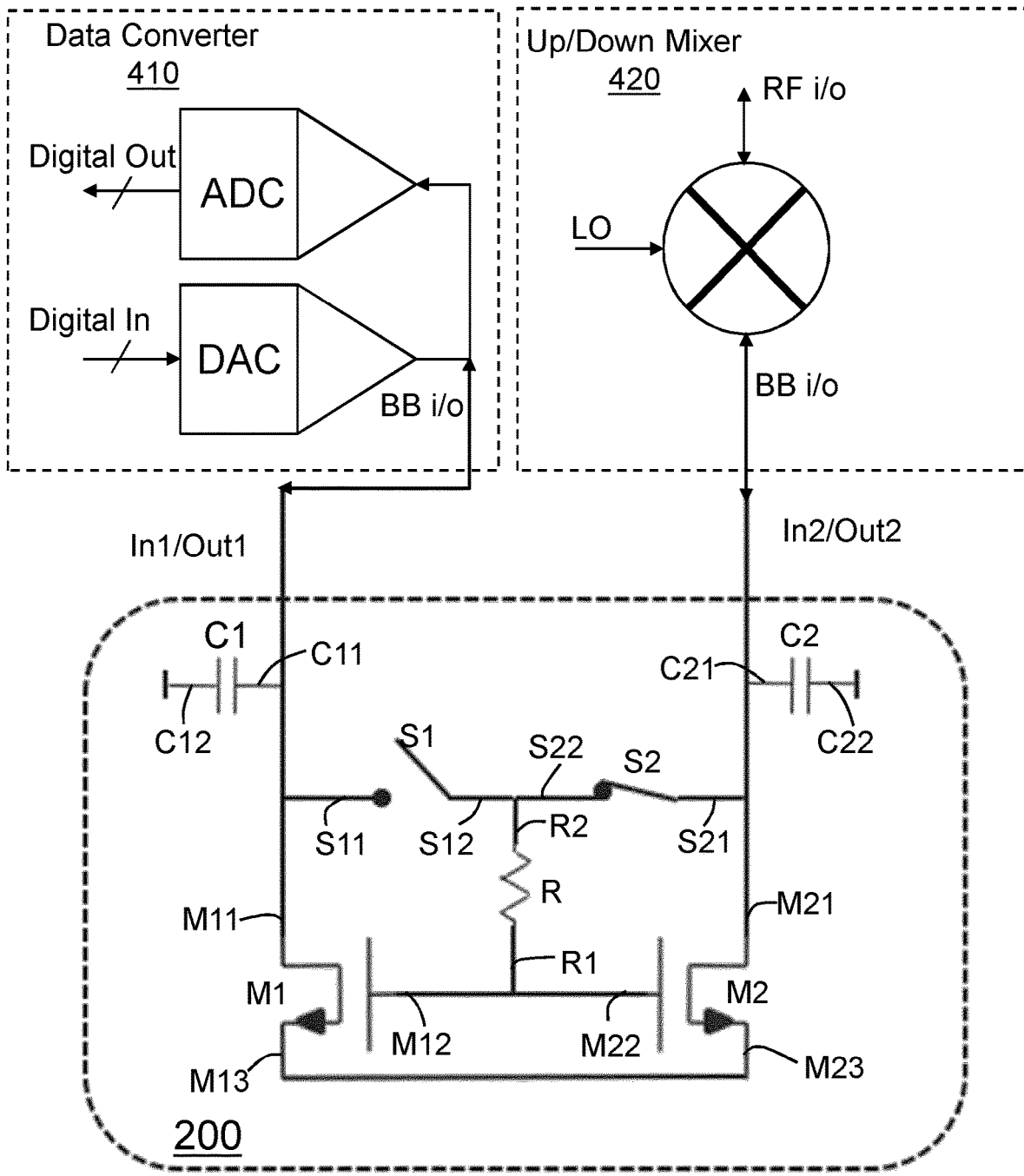
FIG. 4 is a schematic view illustrating a filter circuitry combined with a mixer and a DAC/ADC according to embodiments.

According to some embodiments herein, the filter circuitry 200 may be implemented in a transceiver. FIG. 4 shows an example implementation of the filter circuitry 200 used as a LPF in a transceiver chain. The first terminal In1/Out1 of the filter circuitry 200 may be coupled to a data converter 410, i.e. ADC or DAC, the second terminal In2/Out2 of the filter circuitry 200 may be coupled to a mixer 420, i.e. a frequency up-converter or a frequency down-converter. When the first switch S1 is turned on and the second switch S2 is turned off, the filter circuitry 200 is operating in transmitting mode, when the first switch S1 is turned off and the second switch S2 is turned on, the filter circuitry 200 is operating in receiving mode. The ADC/DAC may be a current mode converter and the mixer may be a passive current mode mixer, and the current-mode mixer may be a gilbert cell mixer.

The bidirectional property of the filter circuitry 200 enables transmitting and receiving operations on the same LPF and mixer chain. In this way, the local oscillator (LO) distribution will become smaller and it will consume less current, since one of the issues of having dedicated Tx and Rx hardware chains is that the LO distribution consumes high current. For example, in a direct quadrature conversion architecture, 4 LO signals need to be routed to both Tx and Rx, at the RF frequency, e.g. 28 GHz. Routing to two blocks adds more capacitive load, increasing current consumption and requires area since these are sensitive wires needing shielding. In addition, due to load pulling, not all unused LO buffers could be turned off. For example, when Tx is off, some of the Tx buffers still need to be running, since turning them on/off will cause glitches on the phase locked loop (PLL) output due to load variation. Another issue with dedicated Tx and Rx chains is the placement of baseband filters. Since LO paths running at RF frequency are prioritized, both Tx and Rx baseband blocks are pushed far away from the mixers. This causes long routings on mixer-baseband interfaces, adding parasitic and causing possible cross talk and interference issues. The bidirectional property of the filter circuitry 200 can solve these issues.

The bidirectional filter circuitry 200 has advantages over the prior art op-amp based LPF solution, since to make an op-amp based LPF bi-directional, the input and output connections need to be swapped by switches. This would add extra resistance and capacitance to the circuitry, making high bandwidth operation even more difficult and costly.

The filter circuitry 200 is simple, no bias voltages and reference currents etc. are required. It may be integrated to many circuits without consuming any extra current. For example, it can use the same current source as the data converter or mixer. Since the whole filter circuitry consists of a single current mirror and the number of stacked transistors is less when it is integrated in the data converter and mixer, it is possible to operate it at a very low supply voltage. Compared to op-amp based solutions, it is a simple and robust way of generating complex poles at high bandwidths. Depending on how it is integrated with converters, it can reach all these features by consuming no extra current in the system, since it can re-use currents of other blocks.

The filter circuitry 200 shows better efficiency in terms of Q of the poles versus spent power. The filter circuitry 200 in current mirror topology fits very well to the DAC and mixer current interfaces. The complex poles are generated without consuming any extra current.

The complex poles of the filter circuitry 200 are formed at the input of the current mirror, i.e. the diode connected transistor side of the current mirror depending on states of the first and second switches, by the capacitor C1/C2, resistor R and transistor M1/M2. The pole positions are independent of the current mirror gain, i.e. current mirror ratio. The current mirror gain may be adjusted without changing the pole positions, making gain programmability possible. If gain is required in the current mirror, this asymmetry needs to be taken care of for bidirectional operation, since gain in one direction will be attenuation in the other direction. For example, if the filter circuitry 200 used as Rx filter requires more gain, then that can be addressed by adding additional current mirrors in front of the ADC, e.g. adding more pMOS transistors, which is used only in the receiving mode.

The filter circuitry 200 inherently has high bandwidth, as the traditional trade-off between bandwidth and current consumption does not exist in this topology.

The filter circuitry 200 is robust compared to op-amp based solutions, since there are no feedback loops, neither differential nor common mode, which eliminates stability issues.

According to some embodiments herein, the filter circuitry 200 may be implemented in any circuit where filtering is needed, such as a phase locked loop circuit or a programmable delay line circuit.

Simulations have been done for the filter circuitry 200 used as bidirectional LPF in two test benches, i.e. baseband (BB) and RF test benches. The filter circuitry 200 is made symmetrical in the simulations giving the same transfer function in both ways of operation.

Figure 5:
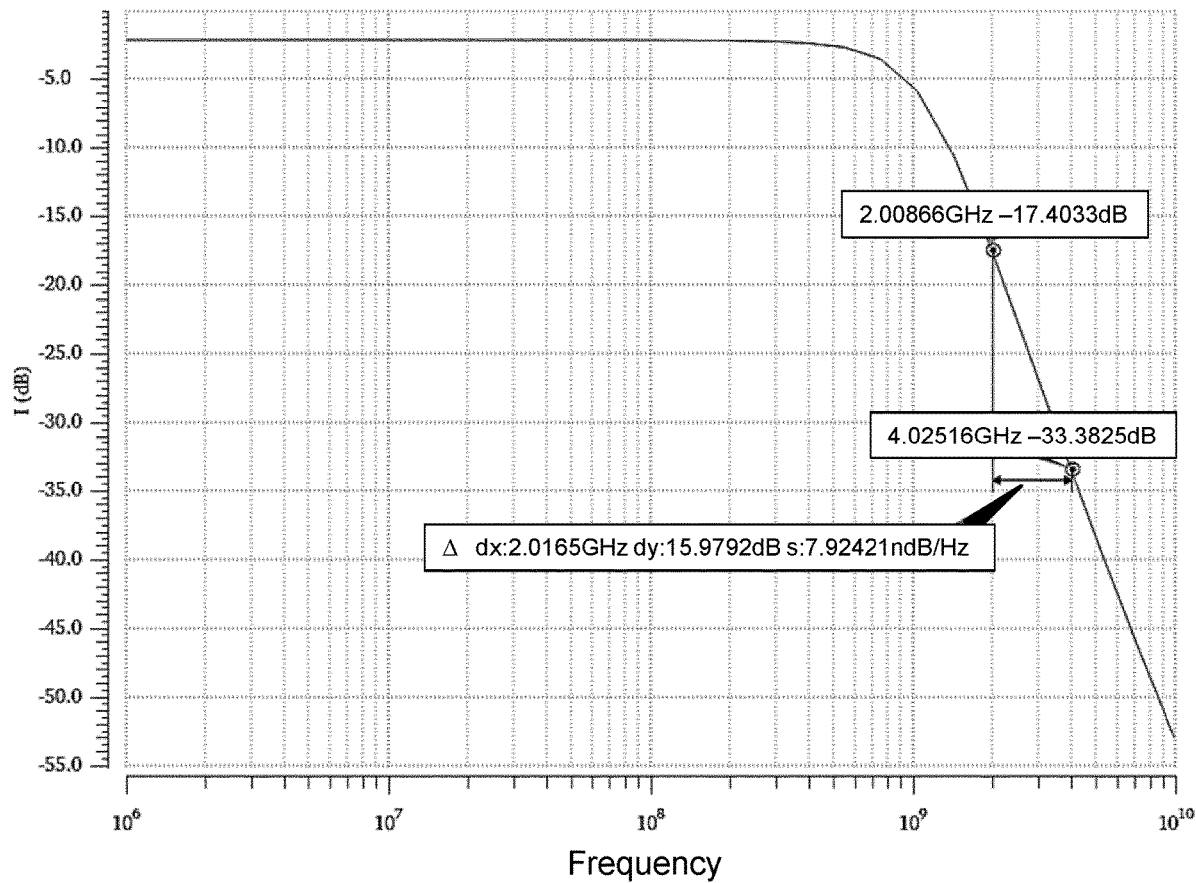
FIG. 5 is a plot showing the simulated transfer function of the filter circuitry according to embodiments herein used in transmitting mode.

FIG. 5 shows the transfer function of the filter circuitry 200 in the baseband test bench, i.e. used as a LPF in Tx mode in a transmitter chain. The complex poles are $-6.939\ e^8 +/- j8.674\ e^8$ with $Q=8.004\ e^{-1}$. The zeros are $5.183\ e^9$, $-8.563\ e^9$.

Figure 6:
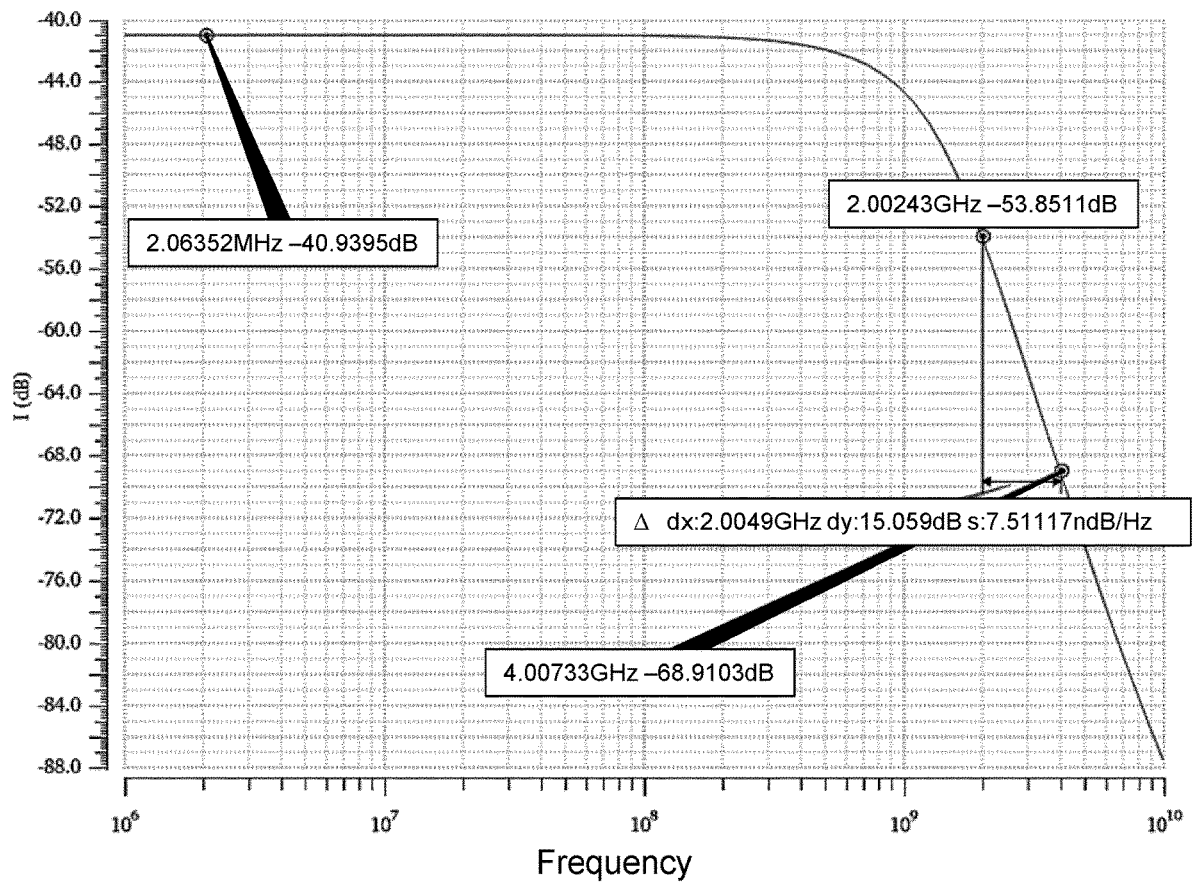
FIG. 6 is a plot showing the simulated transfer function of the filter circuitry according to embodiments herein used in receiving mode.

FIG. 6 shows the transfer function of the filter circuitry 200 in the RF test bench, i.e. used as a LPF in Rx mode in a receiver chain.

As can be seen from FIGS. 5 and 6, the 1 dB bandwidth of the filter circuitry 200 is a bit lower in RF test bench compared to the BB test bench, i.e. around 510 MHz in RF test bench and around 660 MHz in BB test bench.

The current conversion gain of the LPF circuitry 200 and mixer combination in Tx mode is −3.3 dB. In Rx mode, the current conversion gain of the LPF 200 and mixer is −11.7 dB for I and Q respectively.

Figure 7:
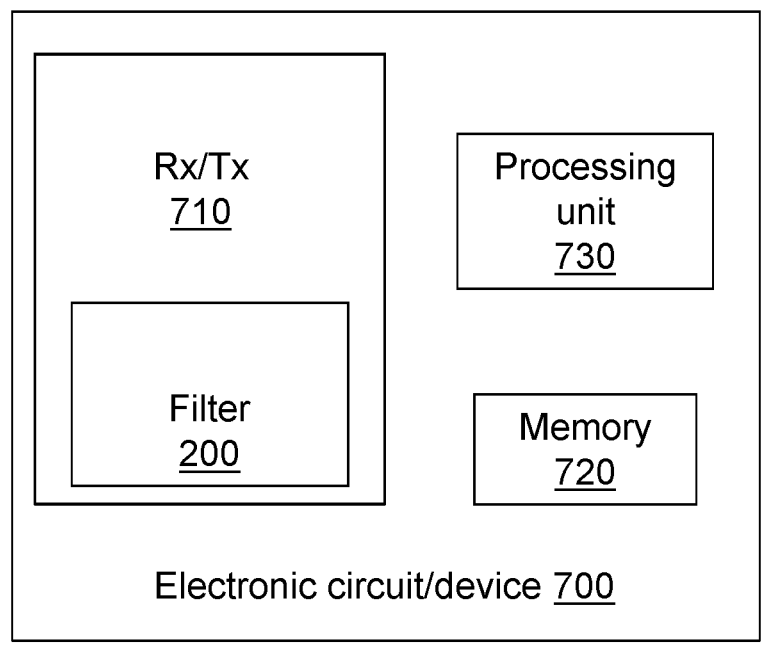
FIG. 7 is a block diagram illustrating an electronic device in which embodiments herein may be implemented.

The filter circuitry 200 according to the embodiments herein may be employed in various electronic circuits or devices. FIG. 7 shows a block diagram for an electronic device 700. The electronic device 700 may comprise a transmitter, a receiver or both, i.e. a transceiver Rx/Tx 710 etc. The electronic device 700 comprises a filter circuitry 200. The electronic device 700 may comprise other units, where a memory 720, a processing unit 730 are shown. The electronic device 700 may be a user equipment or a mobile device, a wireless communication device, a radio base station for a cellular communication system.

Although the filter circuitry 200 shown in FIGS. 2 and 4 are implemented using NMOS transistors, PMOS, bi-polar implementation are also possible both for the filter circuitry 200. Those skilled in the art will understand that the filter circuitry 200 according to embodiments herein may be implemented by any semiconductor technology, e.g. Bi-polar, NMOS, PMOS, CMOS, field-effect transistor (FET) or Micro-Electro-Mechanical Systems (MEMS) technology etc. Depending on the type of transistor used, the first, second and third terminals of the first and second transistors M1, M2 may be referred respectively as gate, source, drain for MOS or FET transistors, or as base, emitter, collector for bi-polar transistor.

The circuits described herein, such as the filter circuitry 200, the transceiver, the phase locked loop circuit, and the programmable delay line, are suitable for integration on an integrated circuit. Hence, according to some embodiments, there is provided an integrated circuit comprising one or more of such circuits.

The word "comprise" or "comprising", when used herein, shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A filter circuitry having a first terminal and a second terminal and comprising:
    a first transistor having a first terminal, a second terminal and a third terminal;
    a second transistor having a first terminal, a second terminal and a third terminal;
    a first switch and a second switch;
    a first capacitor and a second capacitor; and
    a resistor; wherein
    the first terminal of the first transistor, a first terminal of the first switch and a first terminal of the first capacitor are connected to the first terminal of the filter circuitry;
    the first terminal of the second transistor, a first terminal of the second switch and a first terminal of the second capacitor are connected to the second terminal of the filter circuitry;
    the second terminal of the first transistor, the second terminal of the second transistor and a first terminal of the resistor are connected together;
    the third terminals of the first and second transistors are connected together;
    a second terminal of the first switch, a second terminal of the second switch and a second terminal of the resistor are connected together;
    second terminals of the first and second capacitors are connected to a signal ground; and wherein
    the filter circuitry is configurable to either have the first terminal as input and the second terminal as output or have the first terminal as output and the second terminal as input by changing on-off states of the first and second switches.

2. The filter circuitry according to claim 1, wherein the first and second capacitors are implemented with variable capacitors or switchable capacitor banks.

3. The filter circuitry according to claim 1, wherein the resistor is implemented with variable resistors or switchable resistor banks.

4. The filter circuitry according to claim 1, wherein the filter circuitry is implemented in a transceiver, and wherein the first terminal of the filter circuitry is coupled to a data converter, the second terminal of the filter circuitry is coupled to a mixer, and wherein when the first switch is turned on and the second switch is turned off, the filter circuitry is operating in transmitting mode, when the first switch is turned off and the second switch is turned on, the filter circuitry is operating in receiving mode.

5. The filter circuitry according to claim 1, wherein the filter circuitry is implemented in a phase locked loop circuit or a programmable delay line circuit.

6. A transceiver, comprising:
a filter circuitry comprising
   a first transistor having a first terminal, a second terminal and a third terminal;
   a second transistor having a first terminal, a second terminal and a third terminal;
   a first switch and a second switch;
   a first capacitor and a second capacitor; and
   a resistor; wherein
   the first terminal of the first transistor, a first terminal of the first switch and a first terminal of the first capacitor are connected to a first terminal of the filter circuitry;
   the first terminal of the second transistor, a first terminal of the second switch and a first terminal of the second capacitor are connected to a second terminal of the filter circuitry;
   the second terminal of the first transistor, the second terminal of the second transistor and a first terminal of the resistor are connected together;
   the third terminals of the first and second transistors are connected together;
   a second terminal of the first switch, a second terminal of the second switch and a second terminal of the resistor are connected together;
   second terminals of the first and second capacitors are connected to a signal ground; and wherein
   the filter circuitry is configurable to either have the first terminal as input and the second terminal as output or have the first terminal as output and the second terminal as input by changing on-off states of the first and second switches;
   a data converter; and
   a mixer;
   wherein the first terminal of the filter circuitry is coupled to the data converter, the second terminal of the filter circuitry is coupled to the mixer, and wherein when the first switch is turned on and the second switch is turned off, the filter circuitry is operating in transmitting mode, when the first switch is turned off and the second switch is turned on, the filter circuitry is operating in receiving mode.

7. An electronic device, comprising:
a filter circuitry comprising
   a first transistor having a first terminal, a second terminal and a third terminal;
   a second transistor having a first terminal, a second terminal and a third terminal;
   a first switch and a second switch;
   a first capacitor and a second capacitor; and
   a resistor; wherein
   the first terminal of the first transistor, a first terminal of the first switch and a first terminal of the first capacitor are connected to a first terminal of the filter circuitry;
   the first terminal of the second transistor, a first terminal of the second switch and a first terminal of the second capacitor are connected to a second terminal of the filter circuitry;
   the second terminal of the first transistor, the second terminal of the second transistor and a first terminal of the resistor are connected together;
   the third terminals of the first and second transistors are connected together;
   a second terminal of the first switch, a second terminal of the second switch and a second terminal of the resistor are connected together;
   second terminals of the first and second capacitors are connected to a signal ground; and wherein
   the filter circuitry is configurable to either have the first terminal as input and the second terminal as output or have the first terminal as output and the second terminal as input by changing on-off states of the first and second switches.

8. The electronic device according to claim 7, wherein the electronic device is any one of a base station and a wireless communication device for a cellular communication system.

* * * * *

UNITED STATES PATENT AND TRADEMARK OFFICE
CERTIFICATE OF CORRECTION

PATENT NO.       : 12,028,033 B2
APPLICATION NO.  : 17/926083
DATED            : July 2, 2024
INVENTOR(S)      : Özdemir et al.

It is certified that error appears in the above-identified patent and that said Letters Patent is hereby corrected as shown below:

In the Specification

In Column 4, Line 65, delete "$i_{in}=g_m \cdot v_{gs}+i_1 \cdot i_2$" and insert -- $i_{in}=g_m \cdot v_{gs}+i_1+i_2$ --, therefor.

Signed and Sealed this
Twenty-ninth Day of October, 2024

Katherine Kelly Vidal
*Director of the United States Patent and Trademark Office*